US012568854B2

(12) United States Patent
Chang et al.

(10) Patent No.: US 12,568,854 B2
(45) Date of Patent: Mar. 3, 2026

(54) SEMICONDUCTOR PACKAGES HAVING SEMICONDUCTOR BLOCKS SURROUNDING SEMICONDUCTOR DEVICE

(71) Applicant: Taiwan Semiconductor Manufacturing Company, Ltd., Hsinchu (TW)

(72) Inventors: Kai-Fung Chang, Taipei City (TW); Sheng-Feng Weng, Taichung City (TW); Ming-Yu Yen, MiaoLi County (TW); Chih-Wei Lin, Hsinchu County (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 677 days.

(21) Appl. No.: 17/674,795

(22) Filed: Feb. 17, 2022

(65) Prior Publication Data

US 2023/0260961 A1 Aug. 17, 2023

(51) Int. Cl.
| | |
|---|---|
| *H01L 25/065* | (2023.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |
| *H01L 23/64* | (2006.01) |

(52) U.S. Cl.
CPC ...... *H01L 25/0655* (2013.01); *H01L 21/4857* (2013.01); *H01L 21/56* (2013.01); *H01L 23/3142* (2013.01); *H01L 23/49811* (2013.01); *H01L 23/49822* (2013.01); *H01L 23/647* (2013.01); *H01L 24/32* (2013.01); *H01L 24/83* (2013.01); *H01L 2224/26175* (2013.01); *H01L 2224/32221* (2013.01); *H01L 2224/83951* (2013.01)

(58) Field of Classification Search
CPC ........... H01L 21/4857; H01L 23/49822; H01L 21/56; H01L 23/3142; H01L 23/49811; H01L 24/32
See application file for complete search history.

(56) References Cited

U.S. PATENT DOCUMENTS

| | | | |
|---|---|---|---|
| 8,993,380 | B2 | 3/2015 | Hou et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |

(Continued)

*Primary Examiner* — Ratisha Mehta
*Assistant Examiner* — Mikka Liu
(74) *Attorney, Agent, or Firm* — JCIPRNET

(57) ABSTRACT

A semiconductor package includes a first substrate and a first semiconductor device. The first semiconductor device is bonded to the first substrate and includes a second substrate, a plurality of first dies and a second die. The first dies are disposed between the first substrate and the second substrate. The second die is surrounded by the first dies. A cavity is formed among the first dies, the first substrate and the second substrate, and a gap is formed between the second die and the first substrate.

20 Claims, 21 Drawing Sheets

200

170　　184 180

182
168
166
140

RDL
158
156
154
152
162
160
150

110 104 206 120 102 110
(202) (208) (204) (202)

209

100

(56)                    References Cited

U.S. PATENT DOCUMENTS

| | | | |
|---|---|---|---|
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2006/0186528 A1* | 8/2006 | Sasaki | H01L 23/49513 |
| | | | 257/E23.036 |
| 2009/0057885 A1* | 3/2009 | Theuss | B81C 1/0023 |
| | | | 257/E23.116 |
| 2009/0141425 A1* | 6/2009 | Dueber | H01L 23/49894 |
| | | | 29/841 |
| 2013/0037930 A1* | 2/2013 | Roh | H01L 23/49816 |
| | | | 257/693 |
| 2014/0070428 A1* | 3/2014 | Tanimoto | H01L 25/50 |
| | | | 257/777 |
| 2014/0138851 A1* | 5/2014 | Kim | H01L 23/5386 |
| | | | 257/777 |
| 2014/0183711 A1* | 7/2014 | Soller | H01L 23/49861 |
| | | | 438/122 |
| 2016/0234927 A1* | 8/2016 | Hsieh | H05K 1/0209 |
| 2018/0323150 A1* | 11/2018 | Yu | H01L 25/0655 |
| 2022/0302002 A1* | 9/2022 | Kim | H01L 24/16 |

* cited by examiner 166
140
158
156
154
152
150
162
160
110    104    120    102

172    174    170    180
168    RDL
166
140
158
156
154
152
150
162
160
110    104    120    102

102          102T

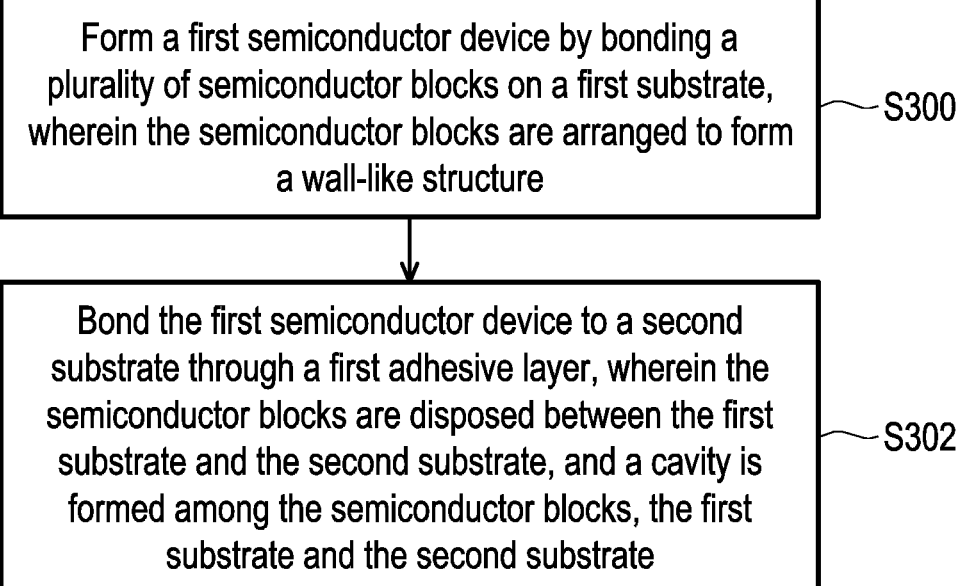

Form a first semiconductor device by bonding a plurality of semiconductor blocks on a first substrate, wherein the semiconductor blocks are arranged to form a wall-like structure          ~S300

Bond the first semiconductor device to a second substrate through a first adhesive layer, wherein the semiconductor blocks are disposed between the first substrate and the second substrate, and a cavity is formed among the semiconductor blocks, the first substrate and the second substrate          ~S302

FIG. 11

SEMICONDUCTOR PACKAGES HAVING SEMICONDUCTOR BLOCKS SURROUNDING SEMICONDUCTOR DEVICE

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 illustrates a manufacturing method of a semiconductor package in accordance with some embodiments.

DETAILED DESCRIPTION

Figure 1A:
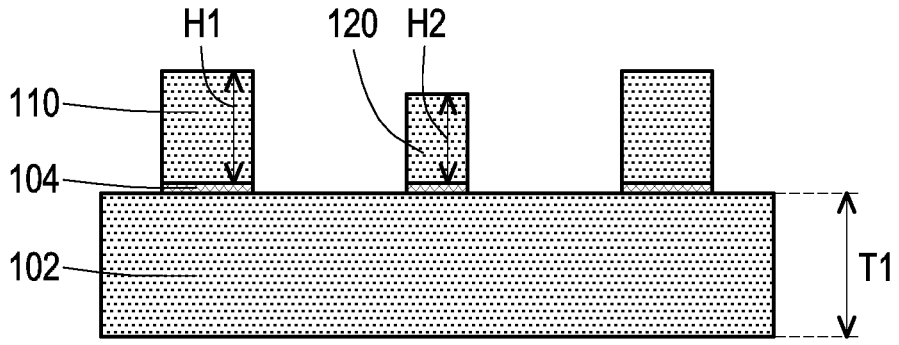
FIG. 1A to FIG. 1I illustrate schematic cross-sectional views of a method of forming a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
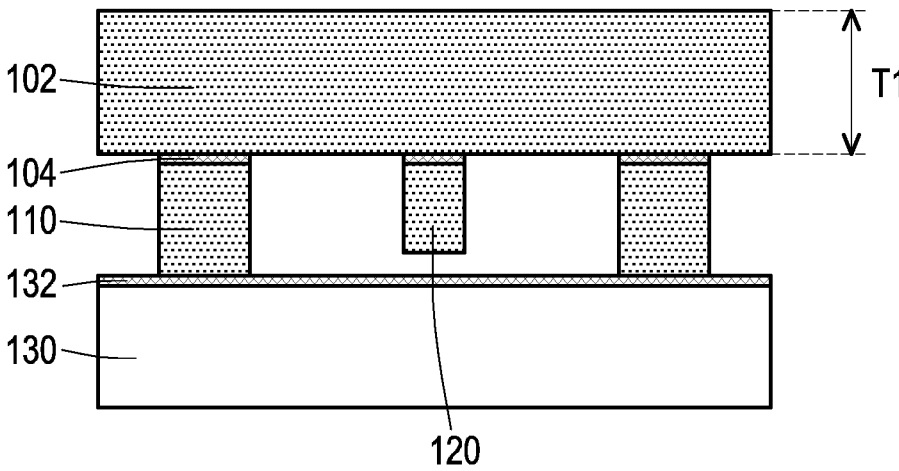
Figure 1C:
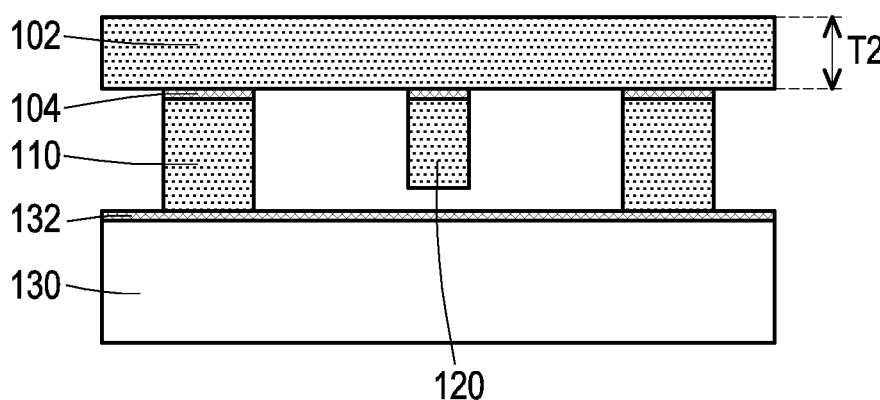
Figure 1D:
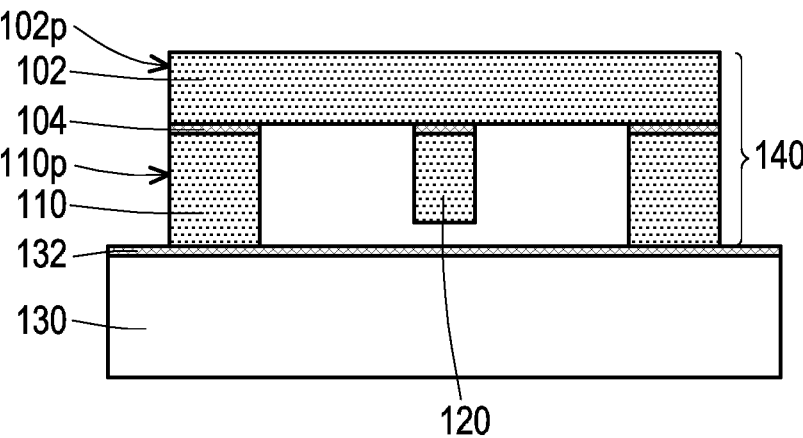
Figure 1E:
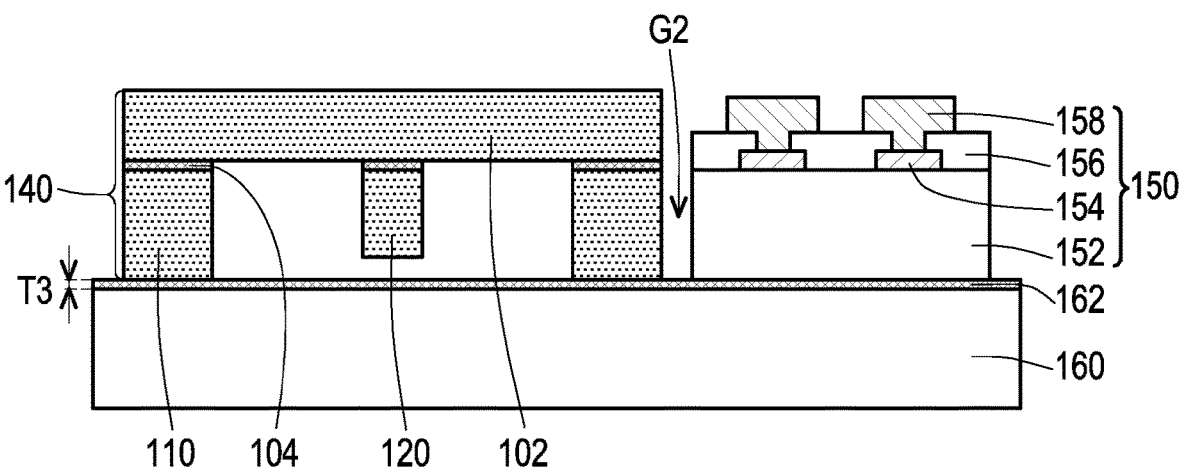
Figure 1F:
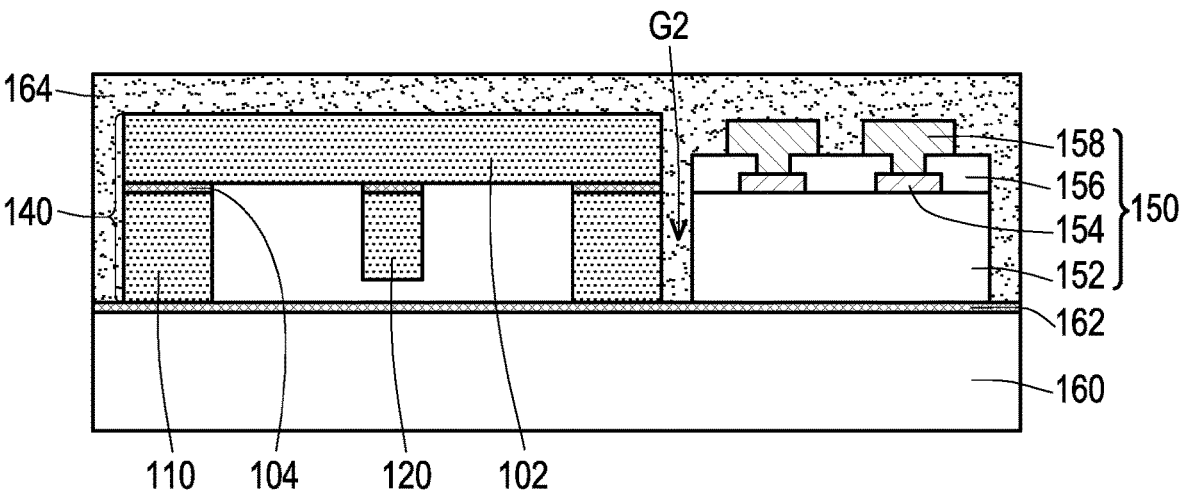
Figure 1G:
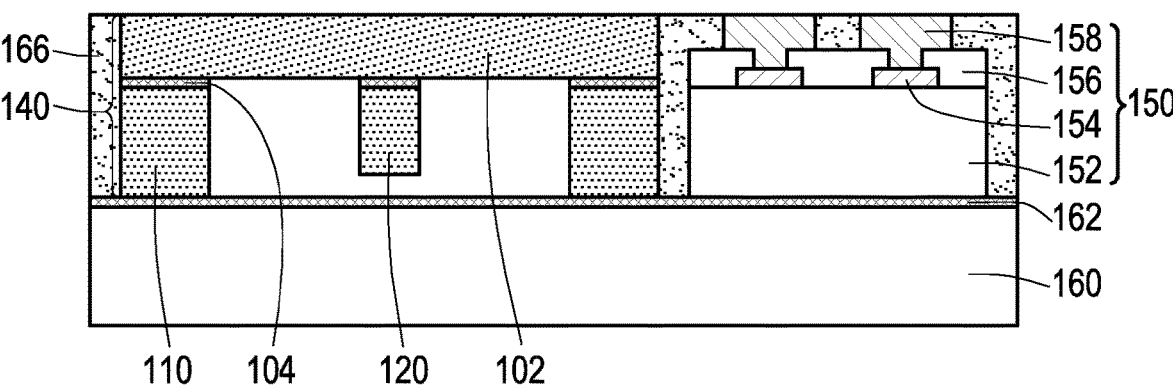
Figure 2A:
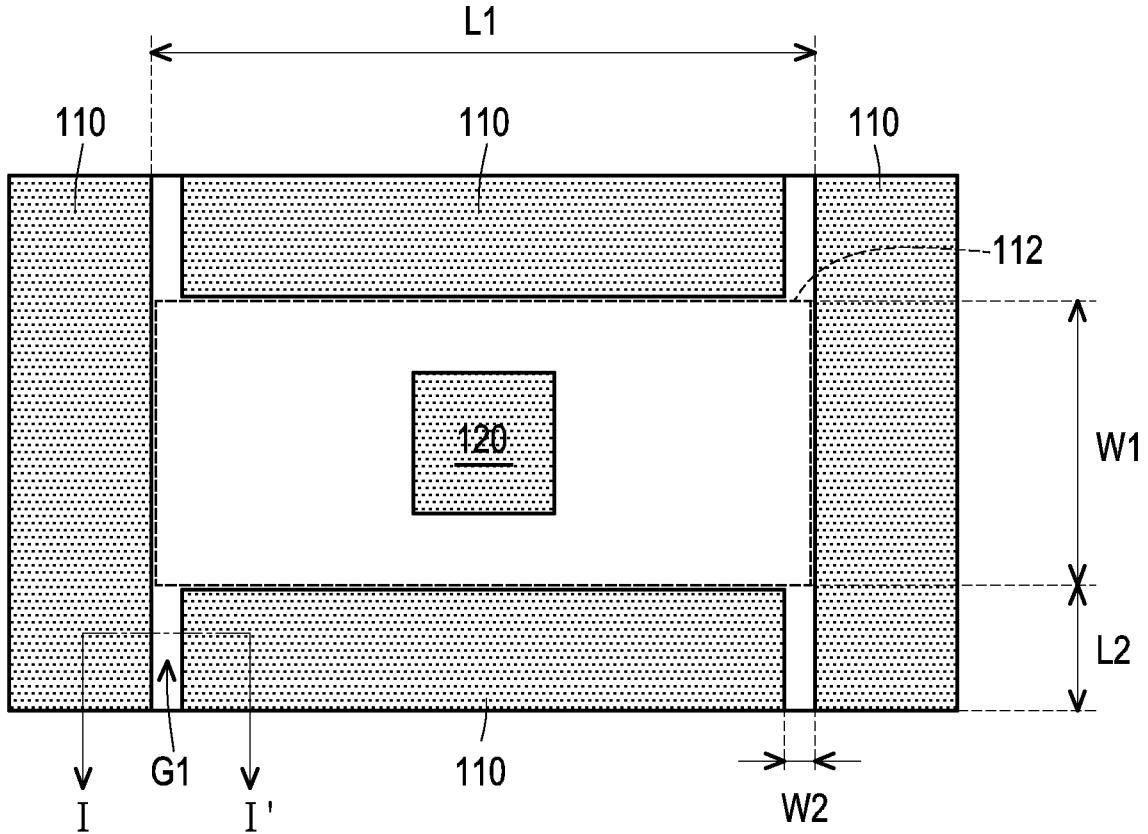
FIG. 2A is a schematic top view showing the structure of FIG. 1A and a portion of the structure of FIG. 1G.
Figure 2B:
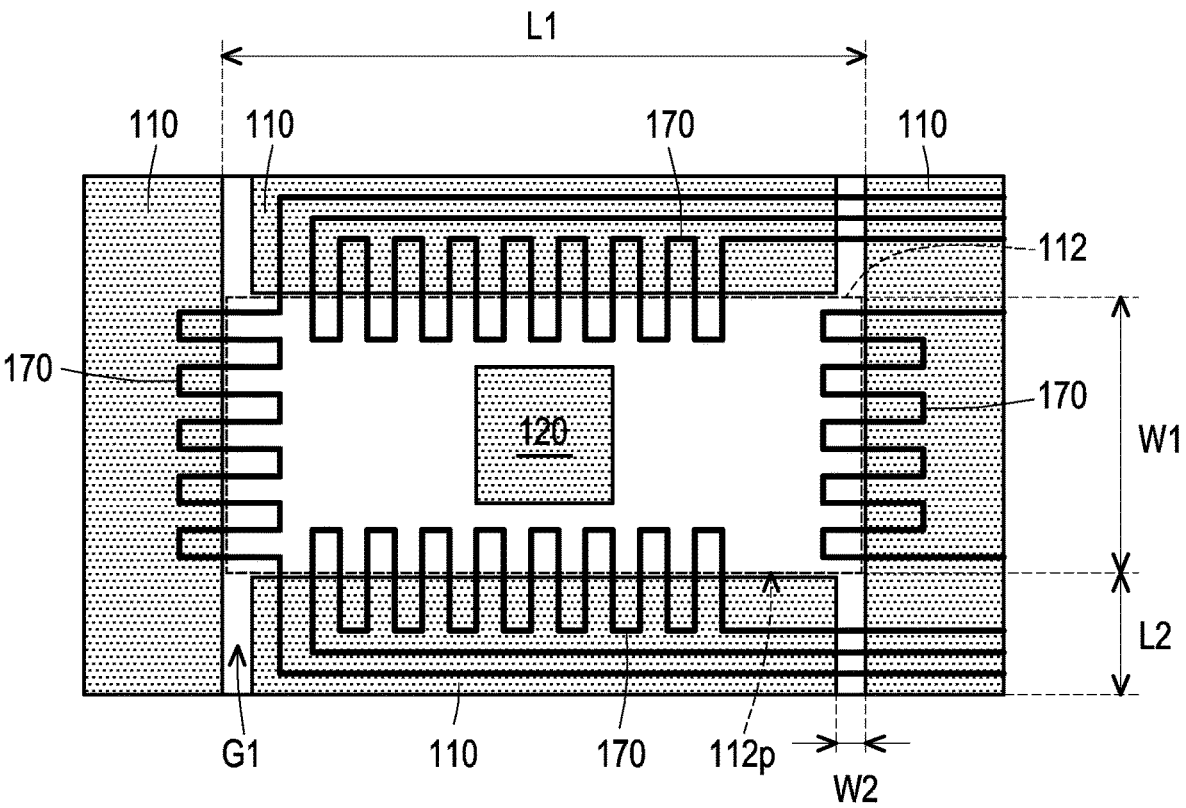
FIG. 2B is a schematic top view showing a portion of the structure of FIG. 1I.
Figure 3:
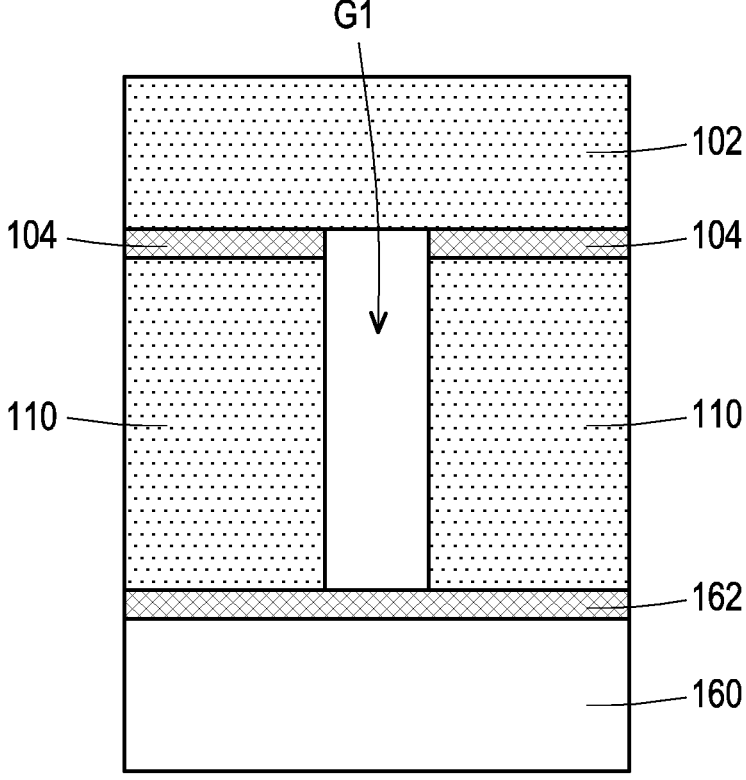
FIG. 3 is a schematic cross-sectional view along line I-I' of FIG. 2A.

FIG. 1A to FIG. 1I illustrate schematic cross-sectional views of a method of forming a semiconductor package in accordance with some embodiments of the disclosure. FIG. 2A is a schematic top view showing the structure of FIG. 1A and a portion of the structure of FIG. 1G, and FIG. 2B is a schematic top view showing a portion of the structure of FIG. 1I. FIG. 3 is a schematic cross-sectional view along line I-I' of FIG. 2A. For clarify, some elements may be omitted in FIG. 2A and FIG. 2B. It is understood that the disclosure is not limited by the method described below. Additional operations can be provided before, during, and/or after the method and some of the operations described below can be replaced or eliminated, for additional embodiments of the methods.

Although FIG. 1A to FIG. 1I are described in relation to a method, it is appreciated that the structures disclosed in FIG. 1A to FIG. 1I are not limited to such a method, but instead may stand alone as structures independent of the method.

Referring to FIGS. 1A and 2A, a plurality of first dies 110 and a second die 120 are provided over a substrate 102. In some embodiments, the substrate 102 is a semiconductor wafer or a semiconductor block. For example, the substrate 102 is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. The substrate 102 has a thickness T1 larger than 700 μm, for example. In some embodiments, the substrate 102 is un-doped and free of active devices. However, the disclosure is not limited thereto.

In some embodiments, the first dies 110 and the second die 120 are picked and placed on the substrate 102. In some embodiments, the first dies 110 and the second die 120 are adhered on the substrate 102 through an adhesive layer 104 such as a die attach film (DAF), respectively. In some embodiments, each of the first dies 110 and the second die 120 includes a semiconductor substrate. The semiconductor substrate may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. A material of the first dies 110 and the second die 120 may be the same as or different from one another. The material of the first dies 110 and the second die 120 may be the same as or different from the material of the substrate 102. In some embodiments, each of the first dies 110 and the second die 120 is also referred to as a semiconductor wafer, a semiconductor block or a semiconductor support. In some embodiments, the first dies 110 and the second die 120 are un-doped and free of active devices. However, the disclosure is not limited thereto.

In some embodiments, the first dies 110 and the second die 120 respectively have a length along a first direction (e.g., x direction) and a width along a second direction (e.g., y direction) substantially perpendicular to the first direction. The length and the width may be substantially equal to or smaller than 2 mm. The width of the first die 110 is larger than the width of the second die 120, and the length of the first die 110 is larger than the length of the second die 120, for example. In some embodiments, the first dies 110 and the second die 120 respectively have a height H1, H2 along a third direction (e.g., z direction) substantially perpendicular to the first direction and the second direction. The height H1, H2 is in a range of about 50 μm to about 600 μm. The height H2 of the second die 120 is smaller than the height H1 of the first dies 110, and a height difference ΔH is formed between the first height H1 and the second height H2. The height difference ΔH may be in a range of about 10 μm to about 200 μm.

In some embodiments, as shown in FIG. 2A, the first dies 110 are arranged to form a wall-like structure to surround the second die 120. For example, the first dies 110 are disposed at four sides of the second die 120, respectively. In some embodiments, a region (also referred to as a flexible region or a sensing region) 112 is surrounded by the first dies 110, and the region 112 has a width W1 and a length L1. The width W1 and the length L1 may be in a range of about 0.5 mm to about 20 mm, respectively. In some embodiments, the second die 120 is disposed at the center of the region 112. In other words, a distance between the second die 120 and the first dies 110 disposed along at a first direction is substantially the same, and a distance between the second die 120 and the first dies 110 disposed along at a second direction is substantially the same. In some embodiments, a gap G1 is formed between the first dies 110, and the gap G1 has a width W2 and a length L2. The width W2 is in a range of about 5 μm to about 50 μm, and the length L2 is larger than 100 μm, for example.

Referring to FIG. 1B, the structure of FIG. 1A is flip-bonded to a temporary carrier 130. The temporary carrier 130 may be a glass carrier, a ceramic carrier, a metal carrier, or the like. In some embodiments, the structure of FIG. 1A is attached onto the temporary carrier 130 through an adhesive layer 132. The adhesive layer 132 may be a die attach film (DAF) or other suitable adhesive material. In some embodiments, a de-bonding layer is further formed between the temporary carrier 130 and the adhesive layer 132. In some embodiments, the de-bonding layer is formed of an adhesive such as Ultra-Violet (UV) glue, Light-to-Heat Conversion (LTHC) glue, or other types of adhesives. In some embodiments, the de-bonding layer is decomposable under the heat of light to release the temporary carrier 130 from the overlying structures that will be formed in subsequent steps. In alternative embodiments, a buffer layer may be formed between the de-bonding layer and the temporary carrier 130. The buffer layer may include a dielectric material layer made of a dielectric material including benzocyclobutene ("BCB"), polybenzooxazole ("PBO"), or any other suitable polymer-based dielectric material.

Referring to FIG. 1C, a thinning process is performed on the substrate 102. In some embodiments, the thinning process is performed on an exposed surface of the substrate 102, so as to remove a portion of the substrate 102. The thinning process may include a grinding process, a chemical mechanical polishing (CMP) process, and/or a planarization process, or other suitable removing process. A cleaning step is optionally performed after thinning to clean and remove the residues generated from the thinning process. After the thinning process, the substrate 102 may have a thickness T2 in a range of about 30 μm to about 500 μm. After thinning, the substrate 102 with a reduced thickness T2 is also referred to as a flexible substrate.

Referring to FIG. 1D, a dicing (cutting) process is performed, so as to form a semiconductor device 140. In some embodiments, during the dicing process, outer portions of the substrate 102 extending beyond a periphery 110p of the first dies 110 are removed. Thus, after the dicing process, a periphery 102p of the substrate 102 is substantially flush with the periphery 110p of the first dies 110. In alternative embodiments, during the dicing process, outer portions of the first dies 110 at the periphery 110p may be slightly removed along with the outer portions of the substrate 102. In addition, in alternative embodiments, the periphery 102p of the substrate 102 is not substantially flush with the periphery 110p of the first dies 110.

Then, the semiconductor device 140 is de-bonded from the temporary carrier 130. That is, the temporary carrier 130, the de-bonding layer and the adhesive layer 132 are removed. In some embodiments, the de-bonding layer (e.g., the LTHC release layer) is irradiated by an UV laser.

Referring to FIG. 1E, the semiconductor device 140 and a semiconductor device 150 are disposed on a substrate 160. In some embodiments, the substrate 160 is formed with an adhesive layer 162 thereon. In some embodiments, the adhesive layer 162 includes an epoxy resin, a phenol resin, acrylic rubber, silica filler, or a combination thereof, and is applied using a lamination technique. The adhesive layer 162 may be also referred to as a die attach film (DAF). The adhesive layer 162 has a thickness T3, and the thickness T3 may be smaller than 20 μm. In some embodiments, the semiconductor device 140 and the semiconductor device 150 are picked and placed on the adhesive layer 162 over the substrate 160.

The semiconductor device 150 may include a semiconductor substrate 152, conductive pads 154 on the semiconductor substrate 152, a dielectric layer 156 on the semiconductor substrate 152, and conductive connectors 158 electrically connected to the conductive pads 154. The conductive pads 154 are disposed in the dielectric layer 156 and exposed by the dielectric layer 156, and the conductive connectors 158 are disposed on the dielectric layer 156, for example. In some embodiments, the conductive connectors 158 include conductive pillars, conductive posts, conductive vias, and/or bumps made of solder, gold, copper, or other suitable conductive materials.

The semiconductor device 150 may include active components (e.g., transistors or the like) and, optionally, passive components (e.g., resistors, capacitors, inductors, etc.) formed on the semiconductor substrate 152. The semiconductor device 150 may have multiple functions. In some embodiments, the semiconductor device 150 is a system on integrated circuit (SoIC) or an application specific integrated circuit (ASIC). However, the disclosure is not limited thereto. The semiconductor device 150 may be a logic die or a memory die. For example, the semiconductor device 150 is a central processing unit (CPU) die, a graphic processing unit (GPU) die, a micro control unit (MCU) die, an input-output (I/O) die, a baseband (BB) die, or an application processor (AP) die or a high bandwidth memory (HBM) die. The semiconductor device 150 may have a thickness the same as or different from a total thickness of the first die 110 and the substrate 102. It should be appreciated that the number of and the function of the semiconductor device 150 to be packaged may depend on the design requirements.

Referring to FIG. 1F, an insulating material 164 is formed over the substrate 160 to encapsulate the semiconductor device 140 and the semiconductor device 150. In some embodiments, the insulating material 164 is formed over the semiconductor device 140 and the semiconductor device 150 and fills up a gap G2 between the semiconductor device 140 and the semiconductor device 150. The insulating material 164 may include a molding compound, a dielectric material such as polybenzoxazole, polyimide, benzocyclobutene, a combination thereof, or other suitable electrically insulating materials, and the insulating material 164 may be applied by compression molding, transfer molding, or the like. In some embodiments, the insulating material 164 includes the molding compound having at least one type of filler-containing resins. The resins may be epoxy resins, phenolic resins or silicon-containing resins. The fillers may be made of non-melting inorganic materials, and the fillers include metal oxide particles, silica particles or silicate particles with the average particle size in a range of about 3 $\mu m$ to about 20 $\mu m$, about 5 $\mu m$ to about 10 $\mu m$ or about 7 $\mu m$ to about 9 $\mu m$.

Referring to FIG. 1G, the insulating material 164 is partially removed to expose the semiconductor device 140 and the semiconductor device 150, and an encapsulant 166 is formed. In some embodiments, a thinning process is performed on the insulating material 164 to reduce the thickness of the insulating material 164 until the substrate 102 of the semiconductor device 140 and the conductive connectors 158 of the semiconductor device 150 are accessibly revealed. The thinning process may include a grinding process, a chemical mechanical polishing (CMP) process, and/or a planarization process, or other suitable removing process. A cleaning step is optionally performed after thinning to clean and remove the residues generated from the thinning process. After reducing the thickness of the insulating material 164, the encapsulant 166 is formed. However, the formation of the encapsulant 166 may be performed through other suitable techniques, the disclosure is not intended to limit to the above description. In some embodiments, during the thinning process, the substrate 102 of the semiconductor device 140 and the conductive connectors 158 of the semiconductor device 150 may be slightly removed and planarized. In other words, the substrate 102 and the conductive connectors 158 may have planarized surfaces. In some embodiments, after forming the encapsulant 166, a surface (e.g., top surface) of the encapsulant 166 is substantially coplanar with surfaces (e.g., top surfaces) of the semiconductor device 140 and the semiconductor device 150.

FIG. 2A is a schematic top view showing a portion of the structure of FIG. 1G, and FIG. 3 is a schematic cross-sectional view along line I-I' of FIG. 2A. In some embodiments, as shown in FIG. 2A and FIG. 3, the gaps G1 between the first dies 110 remain after forming the encapsulant 166. For example, as shown in FIG. 3, the gaps G1 are disposed among the first dies 110, the substrate 102 and the adhesive layer 162 on the substrate 160. In some embodiments, the encapsulant 166 includes the fillers with the average particle size in a range of about 3 $\mu m$ to about 20 $\mu m$, which is close to the width W2 of the gap G1 between the first dies 110. Accordingly, in case that the encapsulant 166 inevitably flows into the gaps G1 between the first dies 110, the fillers may be liable to block the gaps G1, and the encapsulant 166 is prevented from being flowing into the region 112 surrounding by the first dies 110.

Figure 1H:
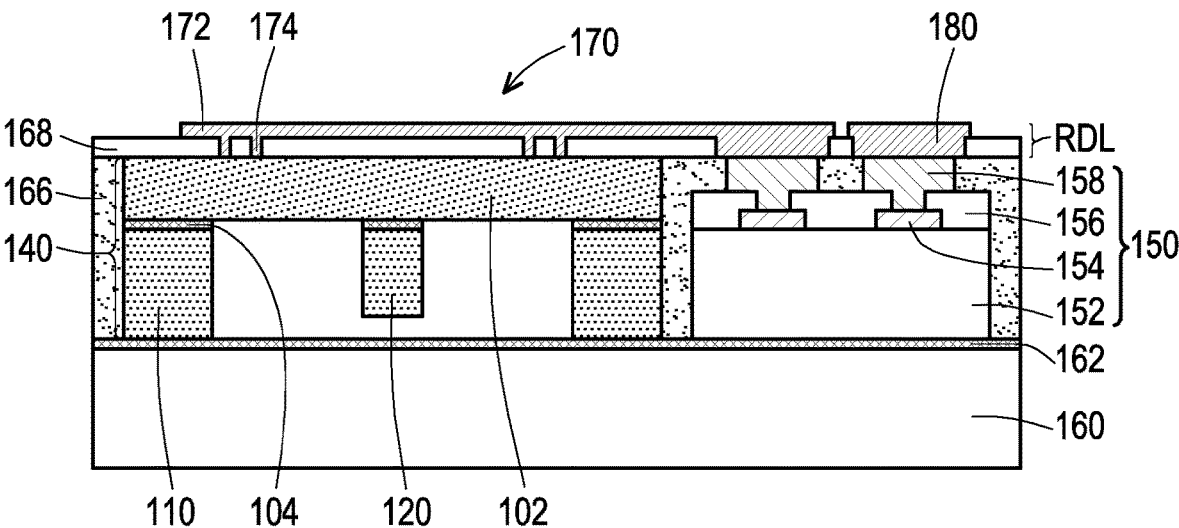
Figure 4A:
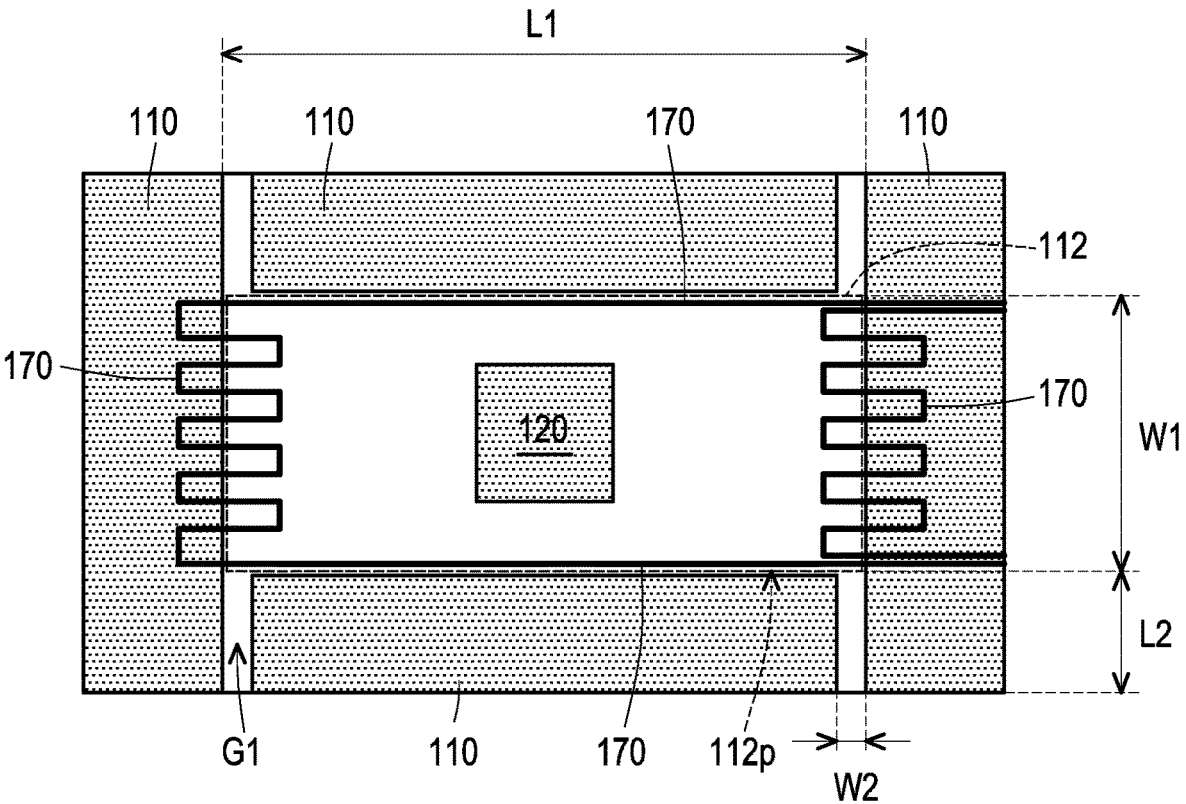
FIG. 4A and FIG. 4B are schematic top views of a semiconductor package in accordance with some embodiments of the disclosure.
Figure 4B:
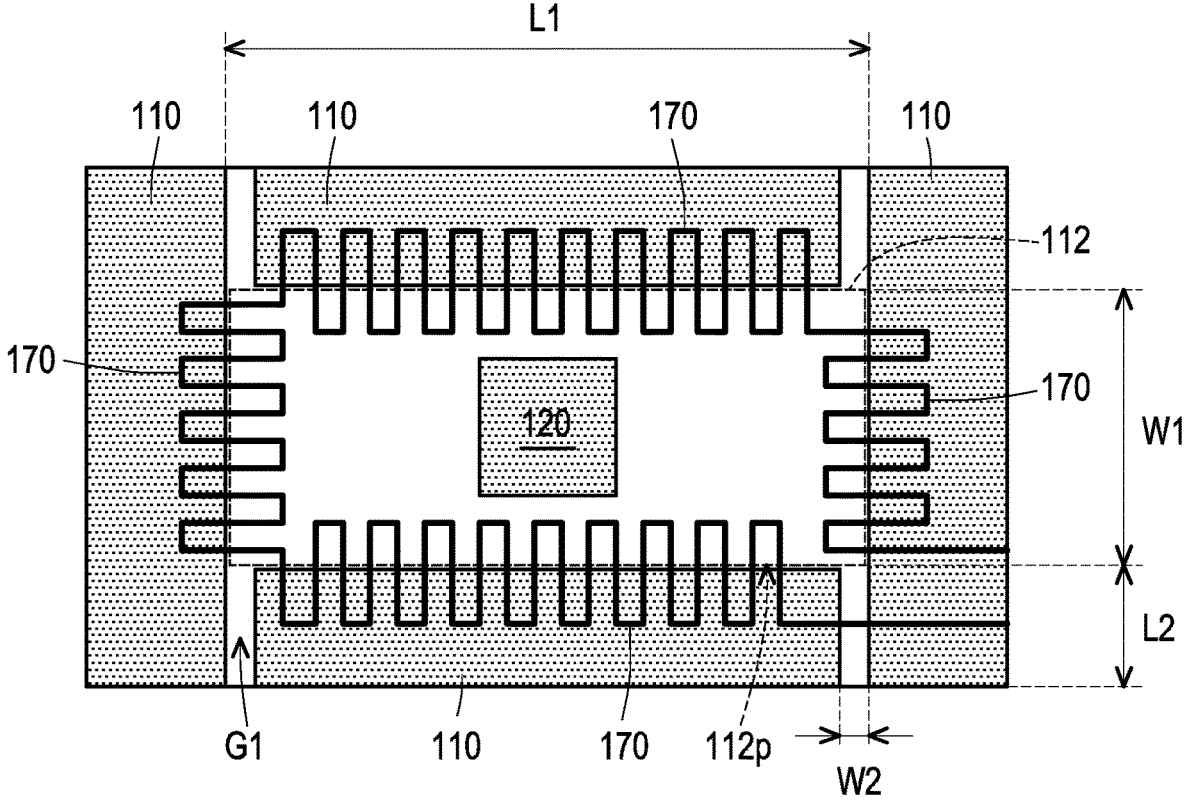

Referring to FIG. 1H, a redistribution layer structure RDL is formed over the semiconductor device 140 and the semiconductor device 150. In some embodiments, the redistribution layer structure RDL includes at least one sensing electrode 170 on the semiconductor device 140 and at least one conductive pattern 180 on the semiconductor device 150. In some embodiments, the sensing electrode 170 is also referred to as a resistive electrode or a resistive element. In some embodiments, as shown in FIG. 2B, the sensing electrodes 170 are disposed on the substrate 102 along a periphery 112p of the region 112 (i.e., inner sidewalls of the first dies 110). In some embodiments, the sensing electrodes 170 are disposed at sides of the periphery 112p of the region 112, respectively. In some embodiments, the sensing electrodes 170 are electrically isolated from each other. In alternative embodiments, the sensing electrodes 170 are electrically connected to each other. In some embodiments, as shown in FIG. 2B, the sensing electrode 170 is a twisted and turned line, which enlarges a total length around the periphery 112p of the region 112. However, the disclosure is not limited thereto. The sensing electrode 170 may have other suitable configurations. For example, as shown in FIG. 4A, at least one of the sensing electrodes 170 is straight, some sensing electrodes 170 are electrically connected and electrically isolated from other sensing electrodes 170. In alternative embodiments, as shown in FIG. 4B, the sensing electrodes 170 are integrally formed and thus are electrically connected to each other. In some embodiments, as shown in FIG. 1H, the sensing electrode 170 include a line portion 172 horizontally extending over the substrate 102 and via portion (s) 174 between the line portion 172 and the substrate 102. However, the disclosure is not limited thereto. In alternative embodiments (not shown), the sensing electrode 170 may be formed without via portion(s). In other words, the sensing electrodes 170 may have other suitable configurations.

The conductive patterns 180 are disposed on the conductive connectors 158 and electrically connected to the semiconductor device 150 through the conductive connectors 158. The sensing electrodes 170 and the conductive patterns 180 are disposed in an insulating layer 168 on the encapsulant 166, for example. In some embodiments, the insulating layer 168 includes a dielectric material such as polybenzoxazole, polyimide, benzocyclobutene, a combination thereof, or other suitable electrically insulating materials. The insulating layer 168 may be formed any acceptable deposition process, such as spin coating, CVD, laminating, the like, or a combination thereof. In some embodiments, the sensing electrodes 170 and the conductive patterns 180 are electrically connected. For example, the sensing electrodes 170 and the conductive patterns 180 are integrally formed. In such embodiments, the sensing electrodes 170 and the conductive patterns 180 are formed by the same patterning process using one mask. However, the disclosure is not limited thereto. The sensing electrodes 170 and the conductive patterns 180 may be formed separately. The materials of the sensing electrodes 170 and the conductive patterns 180 may be substantially the same or different.

Figure 1I:
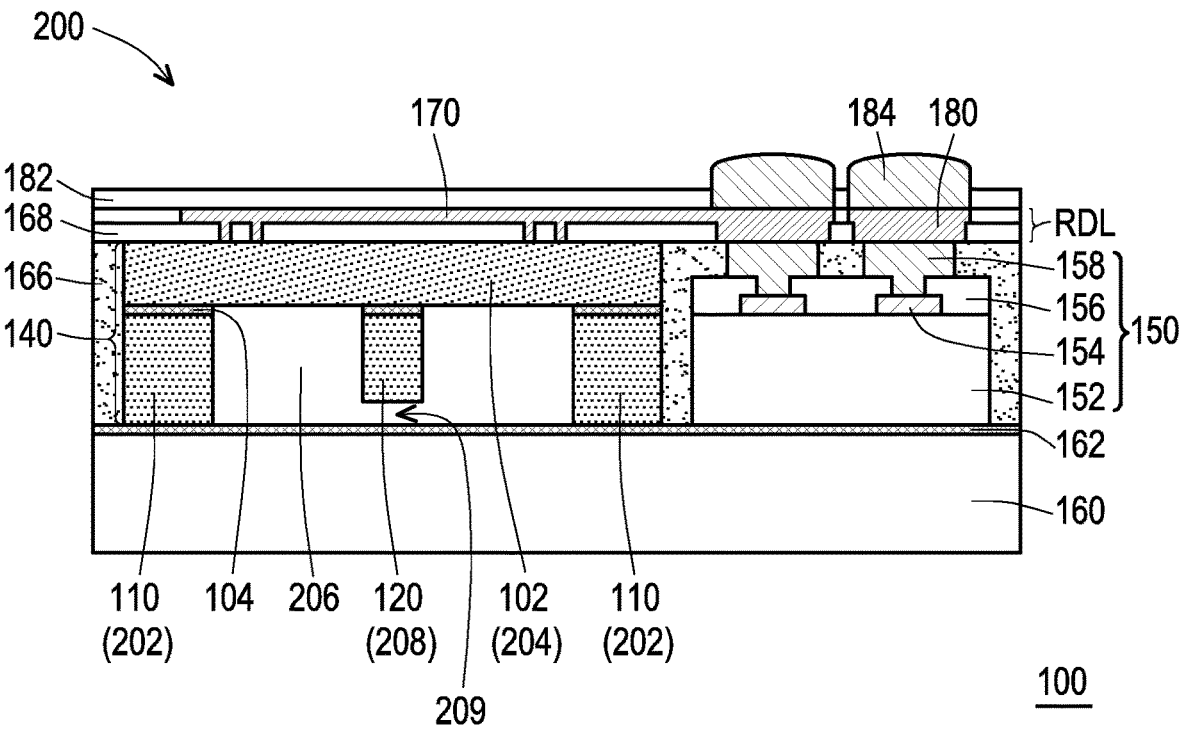

Referring to FIG. 1I, an insulating layer 182 is formed to cover the sensing electrodes 170 and the conductive patterns 180. In some embodiments, the insulating layer 182 includes a dielectric material such as polybenzoxazole, polyimide, benzocyclobutene, a combination thereof, or other suitable electrically insulating materials. The insulating layer 182 may be formed any acceptable deposition process, such as spin coating, CVD, laminating, the like, or a combination thereof. Then, a plurality of conductive connectors 184 may be formed in the insulating layer 182 over the semiconductor device 150, to electrically connect the semiconductor device 150. In some embodiments, the conductive connectors 184 are formed on the conductive patterns 180 and electrically connected to the conductive patterns 180. In some embodiments, the conductive connectors 184 are ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 184 may be formed by a suitable process such as evaporation, plating, ball drop, screen printing, or a ball mounting process.

In some embodiments, as shown in FIG. 1I, a semiconductor package 100 is formed. The semiconductor package 100 is a sensor device and includes a sensor 200 (i.e., microelectromechanical system (MEMS) sensor). In some embodiments, the sensor 200 is a pressure sensor such as a piezo-resistive force sensor. The sensor 200 includes a frame portion 202, a membrane portion (e.g., a diaphragm) 204, a plurality of sensing electrodes (e.g., the sensing electrodes 170) disposed on the membrane portion 204, and a cavity 206 disposed below the membrane portion 204 and surround by the frame portion 202. In some embodiments, the frame portion 202 is formed by the first dies 110, and the membrane portion 204 is formed by the substrate 102 in the sensing region 112. The cavity 206 is formed among the frame portion 202 (i.e., the first dies 110), the membrane portion 204 (i.e., the substrate 102) and the substrate 160. In some embodiments, the sensor 200 further includes a center weight portion 208 (e.g., the second die 120) surrounded by the cavity 206 to avoid the membrane portion 204 overbending, and a gap 209 is formed between the center weight portion 208 (e.g., the second die 120) and the substrate 160. In some embodiments, the gap 209 is formed between the center weight portion 208 (e.g., the second die 120) and the adhesive layer 162 on the substrate 160. In some embodiments, the frame portion 202, the membrane portion 204 and the center weight portion 208 are collectively referred to as a MEMS substrate. In alternative embodiments, the MEMS substrate is formed without the center weight portion 208. In other words, the second die 120 may be omitted.

In some embodiments, the semiconductor package 100 further includes the insulating layer 168 formed on the top surface of the MEMS substrate, the insulating layer 182 formed on the insulating layer 168, the conductive connectors 184 and the conductive patterns 180 electrically connecting the sensing electrodes 170 and the conductive connectors 184.

As shown in FIG. 2B, the sensor 200 includes four sensing electrodes 170. The cavity 206 is substantially sealed to form a closed space. When the pressure outside the sensor 200 differs from the pressure inside the cavity 206, the membrane portion 204 deforms. The deformation of the membrane portion 204 causes a change in the resistance of the sensing electrodes 170. In some embodiments, the four sensing electrodes 170 are not electrically connected, and the applied pressure is measured by calculating a sum of the change in resistance of all sensing electrodes 170. In alternative embodiments, the sensing electrodes 170 are electrically connected, and the change in resistance of each sensing electrode 170 directly corresponds to the applied pressure. In some embodiments, an amplifying circuit (e.g., transistors) is integrated into the sensor 200 to output a signal corresponding to the applied pressure. In some embodiments, the semiconductor device 150 includes an electronic circuit, and the electronic circuit includes an amplifier, a signal processor and/or an I/O circuit. The electronic circuit may be electrically coupled to the sensing electrodes 170 of the sensor 200 and receives a signal from the sensor 200. In alternative embodiments, the electronic circuit is an integrated circuit (IC) separately manufactured from and attached to the MEMS substrate.

In some embodiments, the MEMS substrate is formed by picking and placing the dies on the semiconductor substrate and thinning the semiconductor substrate. Then, by packaging the MEMS substrate and another semiconductor device, and forming the RDL structure for both sensing and communicating, the force sensor is formed. In other words, the force sensor is formed by combining the packaging process and the integrated fan-out (InFo) process. Accordingly, in some embodiments, compared to an embodiment including forming a MEMS structure by deep reactive ion etching processes and implantation processes and wire bonding the MEMS structure with another package, the aforementioned processes (i.e., the etching, implantation and wire bonding processes) may be omitted and the formed force sensor may have a smaller size. In addition, since the semiconductor substrate (e.g., the substrate 102) of the MEMS substrate is formed without implantation process, the semiconductor substrate (e.g., the substrate 102) may be thinner, so as to achieve improved sensitivity.

Figure 5A:
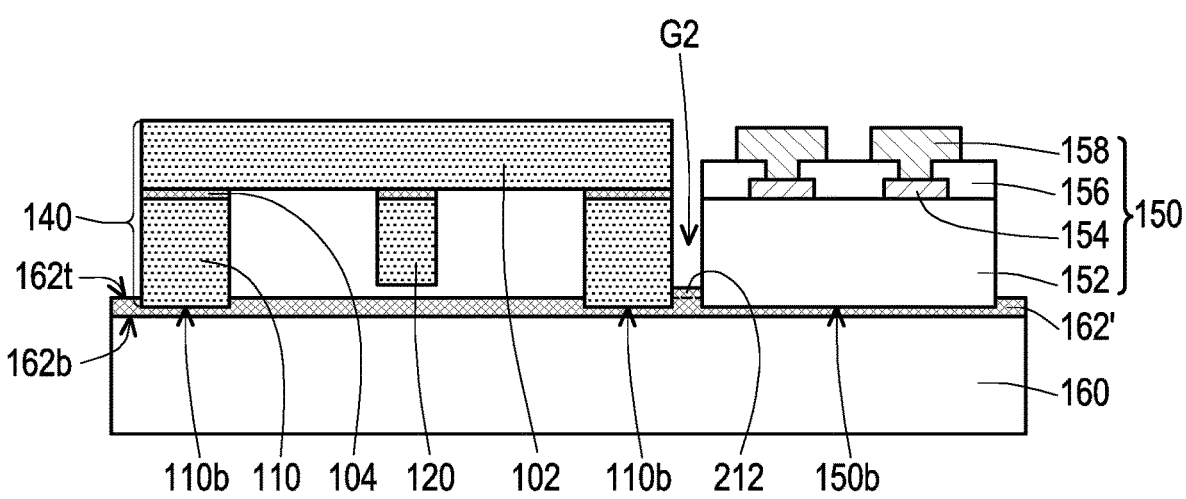
FIG. 5A to FIG. 5C illustrate schematic cross-sectional views of a method of forming a semiconductor package in accordance with some embodiments of the disclosure.
Figure 5B:
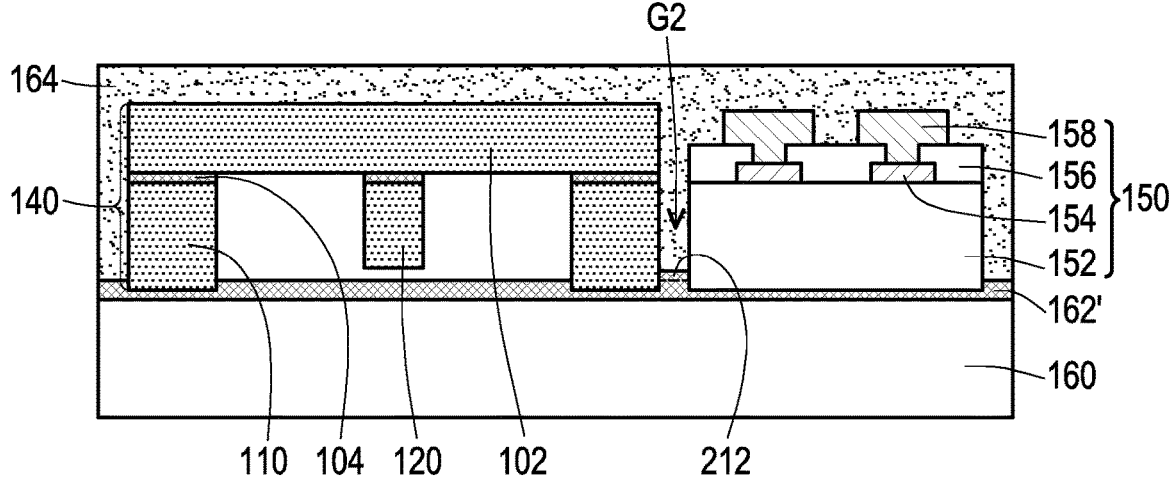
Figure 5C:
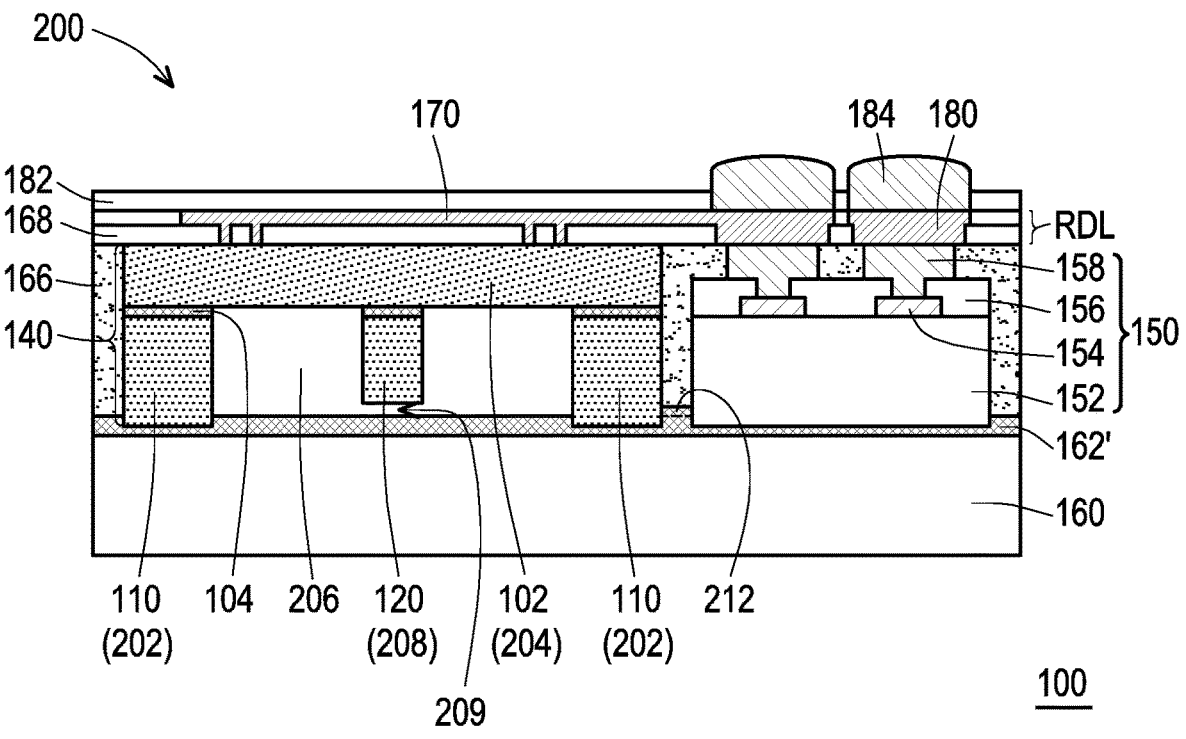
Figure 6A:
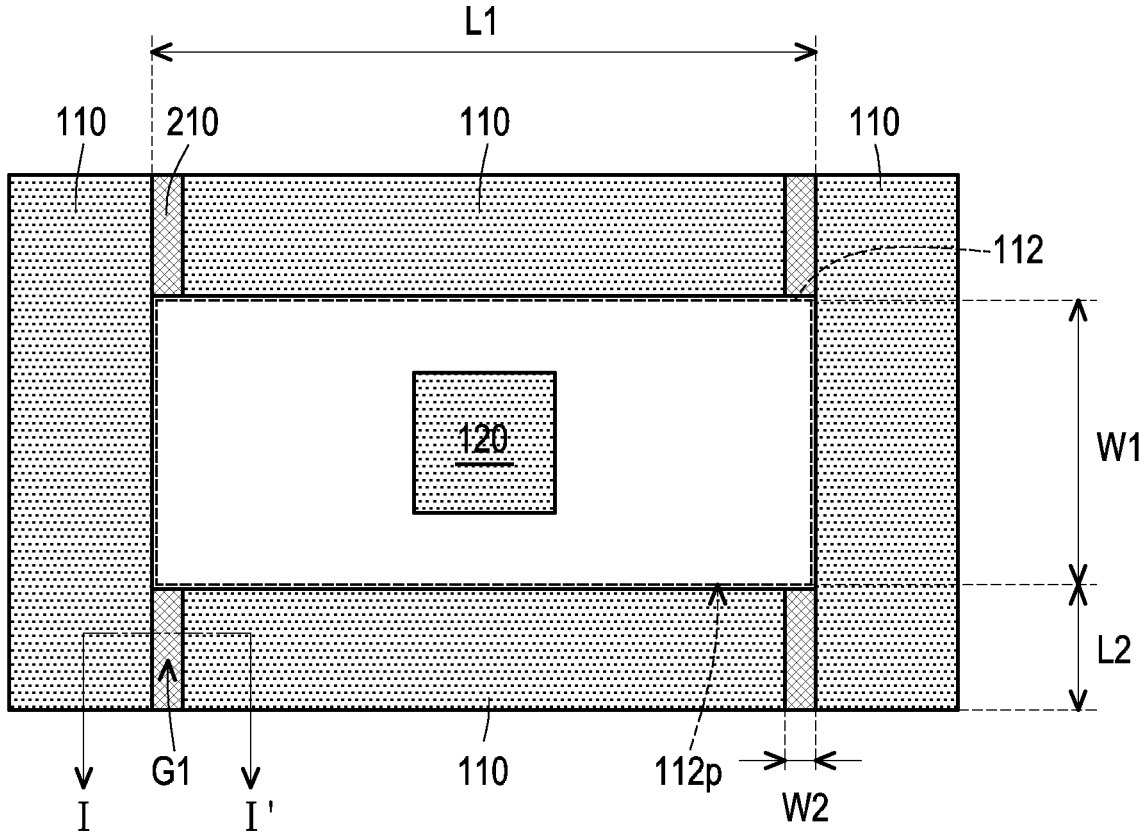
FIG. 6A and FIG. 6B are respectively schematic top views showing a portion of the structure of FIG. 5A and FIG. 5C.
Figure 6B:
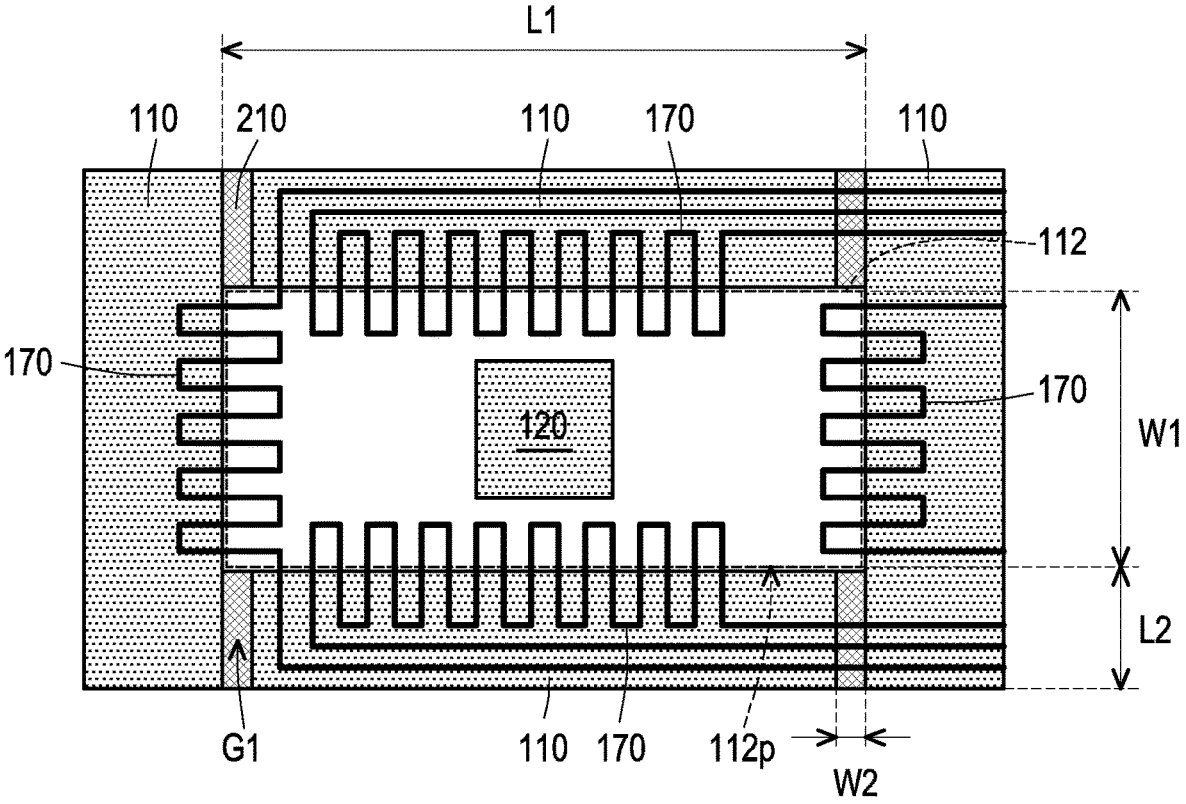
Figure 7:
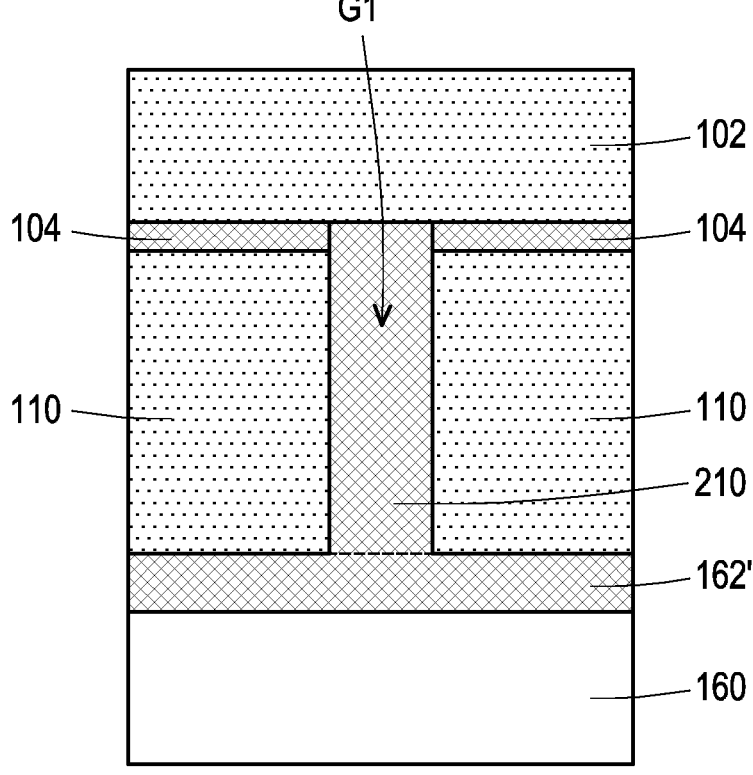
FIG. 7 is a schematic cross-sectional view along line I-I' of FIG. 6A.

FIG. 5A to FIG. 5C illustrate schematic cross-sectional views of a method of forming a semiconductor package in accordance with some embodiments of the disclosure. FIG. 6A and FIG. 6B are respectively schematic top views showing a portion of the structure of FIG. 5A and FIG. 5C. For clarify, some elements may be omitted in FIG. 6A and FIG. 6B. FIG. 7 is a schematic cross-sectional view along line I-I' of FIG. 6A. The semiconductor package of FIG. 5C and FIG. 6B is similar to the semiconductor package of FIG. 1I and FIG. 2B, and the difference lies in an adhesive layer 162' and sealants 210.

Referring to FIG. 5A, an adhesive layer 162' is formed on the substrate 160. In some embodiments, the adhesive layer 162' includes film over wire (FOW)-like material and has a viscosity less than the die attach film (DAF). For example, the adhesive layer 162' has a viscosity smaller than $1.50 \times 10^6$ poise at 170° C. Thus, the adhesive layer 162' is more flowable compared to the DAF. In some embodiments, the adhesive layer 162' has a thickness in a range of 20 μm to 100 μm.

Then, the semiconductor device 140 and a semiconductor device 150 are picked and placed on the adhesive layer 162' over the substrate 160. In some embodiments, a viscosity of the adhesive layer 162' is smaller than a viscosity of the adhesive layer 104 between the substrate 102 and the first dies 110 and/or a viscosity of the adhesive layer 104 between the substrate 102 and the second die 120. In some embodiments, as shown in FIG. 5A, FIG. 6A and FIG. 7, after placing the semiconductor device 140 on the adhesive layer 162', since the adhesive layer 162' has a low viscosity, the adhesive layer 162' further fills up the gaps G1 between the first dies 110, to form sealants 210. Accordingly, the gaps G1 between the first dies 110 are entirely or partially sealed by the sealants 210 respectively. In some embodiments, as shown in FIG. 7, the gaps G1 are filled up by the sealants 210. In some embodiments, the sealant 210 is disposed between the first dies 110 and climbed onto sidewalls of the first dies 110. For example, as shown in FIG. 7, the sealant 210 is disposed between the substrate 102 and the adhesive layer 162' on the substrate 160. In some embodiments, as shown in FIG. 5A, a portion of the sidewall of the first die 110 and/or the semiconductor device 150 is embedded in the adhesive layer 162'. In some embodiments, bottom surfaces 110b, 150b of the first die 110 and the semiconductor device 150 are disposed between a bottom surface 162b of the adhesive layer 162' and a top surface 162t of the adhesive layer 162'. In alternative embodiments, the bottom surfaces of the first die 110 and the semiconductor device 150 are substantially flush with the bottom surface of the adhesive layer 162'. However, the disclosure is not limited thereto. The first die 110 and/or a portion of the semiconductor device 150 may be disposed on the adhesive layer 162' without being embedded in the adhesive layer 162'.

In some embodiments, the material of the sealant 210 is substantially the same as the material of the adhesive layer 162'. The sealant 210 is disposed on the adhesive layer 162', and there is no interface between the sealant 210 and the adhesive layer 162', for example. The sealant 210 may have the width (e.g., width W2) and the length (e.g., length L2) substantially the same as that of the gap G1. It is noted that the sealant 210 may inevitably flow into the sensing region 112, however, the location of the sealant 210 is nearby the first die 110, and thus the performance of the to-be formed sensor would not be affected. In some embodiments, as shown in FIG. 5A, a portion of the adhesive layer 162' further fills a gap G2 between the semiconductor device 140 and the semiconductor device 150, to form a sealant 212 between the semiconductor device 140 and the semiconductor device 150. Since the gap G2 between the semiconductor device 140 and the semiconductor device 150 may be significantly larger than the gap G1 between the first dies 110, a height of the sealant 212 is significantly smaller than the height of the sealant 210. In some embodiments, the sealant 210 fills the gap G1 between the first dies 110 and the sealant 212 fills the gap G2 between the semiconductor device 140 and the semiconductor device 150, and thus the sealants 210 and 212 are also referred to as gap-filling portions of the adhesive layer 162'.

Referring to FIG. 5B, an insulating material 164 is formed over the substrate 160 to encapsulate the semiconductor device 140 and the semiconductor device 150. The formation of the insulating material 164 may be similar to the formation of the insulating material 164 in the previous embodiments, so the detailed description thereof is omitted herein. In some embodiments, the insulating material 164 flows into the gap G2 between the semiconductor device 140 and the semiconductor device 150. For example, the insulating material 164 is formed on the sealant 212 between the semiconductor device 140 and the semiconductor device 150. However, the disclosure is not limited thereto. In alternative embodiments, the insulating material 164 is directly disposed on the adhesive layer 162'. In some embodiments, since the gaps G1 between the first dies 110 are pre-filled by the sealants 210, the insulating material 164 is prevented from flowing into the sensing region 112.

Referring to FIG. 5C and FIG. 6B, after performing the steps similar to FIG. 1G to FIG. 1I, the semiconductor package 100 is formed. In some embodiments, the semiconductor package 100 has the sealants 210 between the first dies 110 and the sealant 212 between the first die 110 and the semiconductor device 150. In such embodiments, the gaps G1 between the first dies 110 are pre-filled by the sealants 210, and thus the encapsulant 166 (i.e., the insulating material 164) is prevented from flowing into the sensing region 112 of the semiconductor package 100 through the gaps G1 between the first dies 110. Accordingly, the semiconductor package 100 may have an improved performance.

Figure 8:
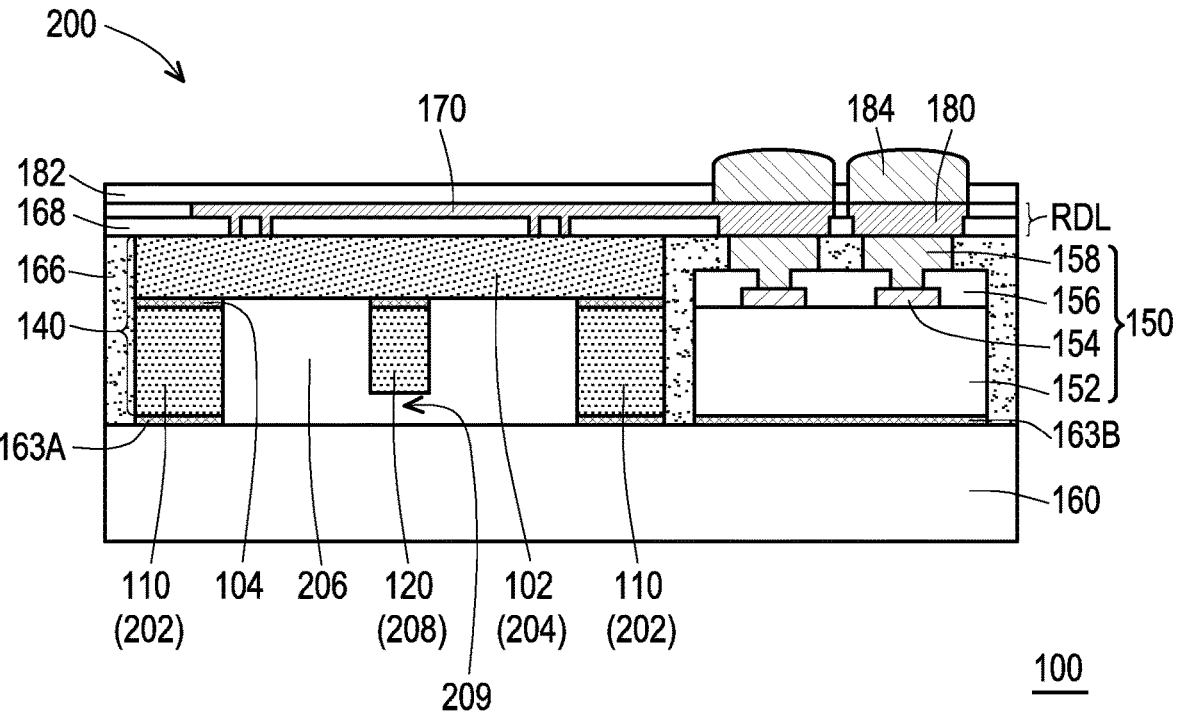
FIG. 8 illustrates a schematic cross-sectional view of a semiconductor package in accordance with some embodiments of the disclosure.

In above embodiments, the adhesive layer 162, 162' is formed over the substrate 160, and then the semiconductor device 140 and the semiconductor device 150 are picked and placed on the adhesive layer 162, 162'. However, the disclosure is not limited thereto. In alternative embodiments, as shown in FIG. 8, the semiconductor device 140 and the semiconductor device 150 are formed with an adhesive layer 163A, 163B respectively, and then the semiconductor device 140 and the semiconductor device 150 with the adhesive layer 163A, 163B thereon are picked and placed on the substrate 160. In such embodiments, a sidewall of the semiconductor device 140 is substantially flush with a sidewall of the adhesive layer 163A, and a sidewall of the semiconductor device 150 is substantially flush with a sidewall of the adhesive layer 163B.

In some embodiments, the semiconductor device 140 is formed by the steps of FIG. 1A to FIG. 1D. However, the disclosure is not limited thereto.

FIG. 9A to FIG. 9D illustrate schematic cross-sectional views of a method of forming a semiconductor device of a semiconductor package in accordance with some embodiments of the disclosure. FIG. 10A and FIG. 10B are schematic top views showing the structures of FIG. 9A and FIG. 9B. It is understood that the disclosure is not limited by the method described below. Additional operations can be provided before, during, and/or after the method and some of the operations described below can be replaced or eliminated, for additional embodiments of the methods.

Figure 9A:
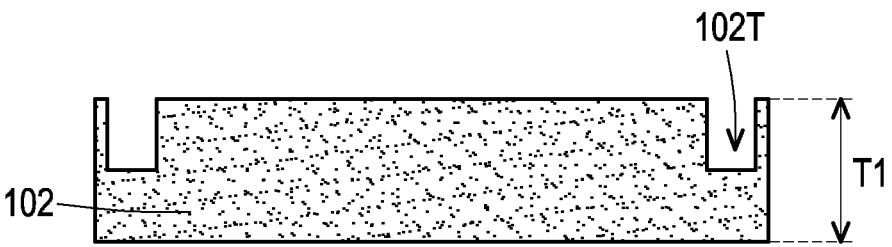
FIG. 9A to FIG. 9D illustrate schematic cross-sectional views of a method of forming a semiconductor device of a semiconductor package in accordance with some embodiments of the disclosure.
Figure 10A:
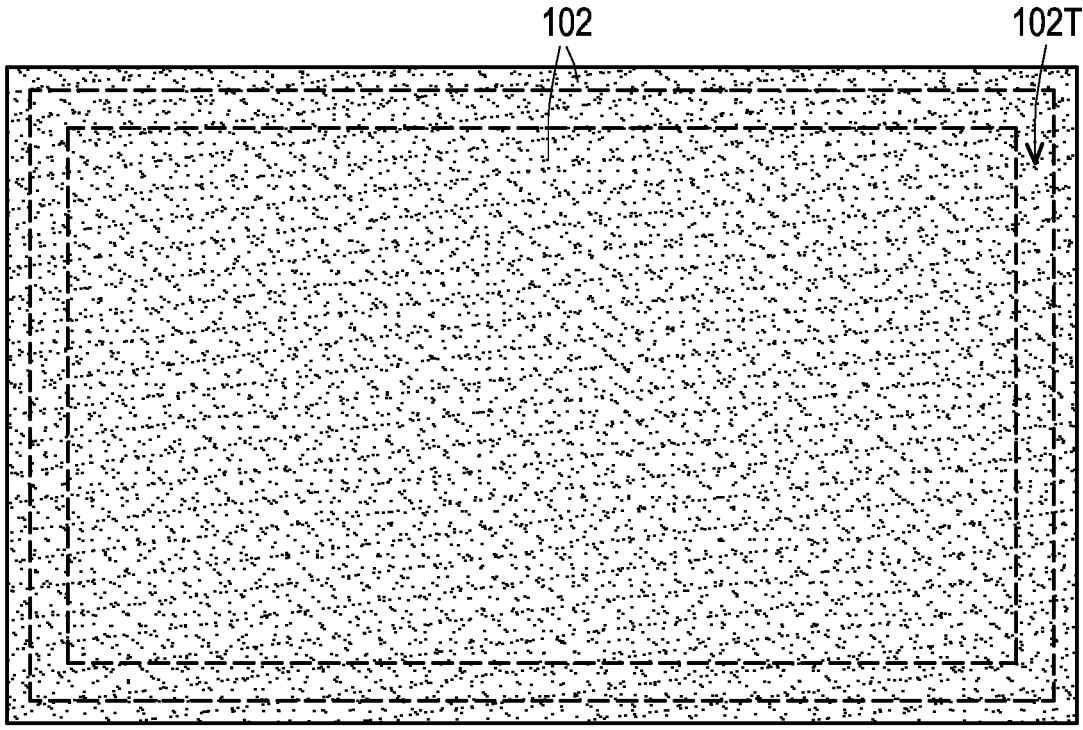
FIG. 10A and FIG. 10B are schematic top views showing the structures of FIG. 9A and FIG. 9B.
Figure 10B:
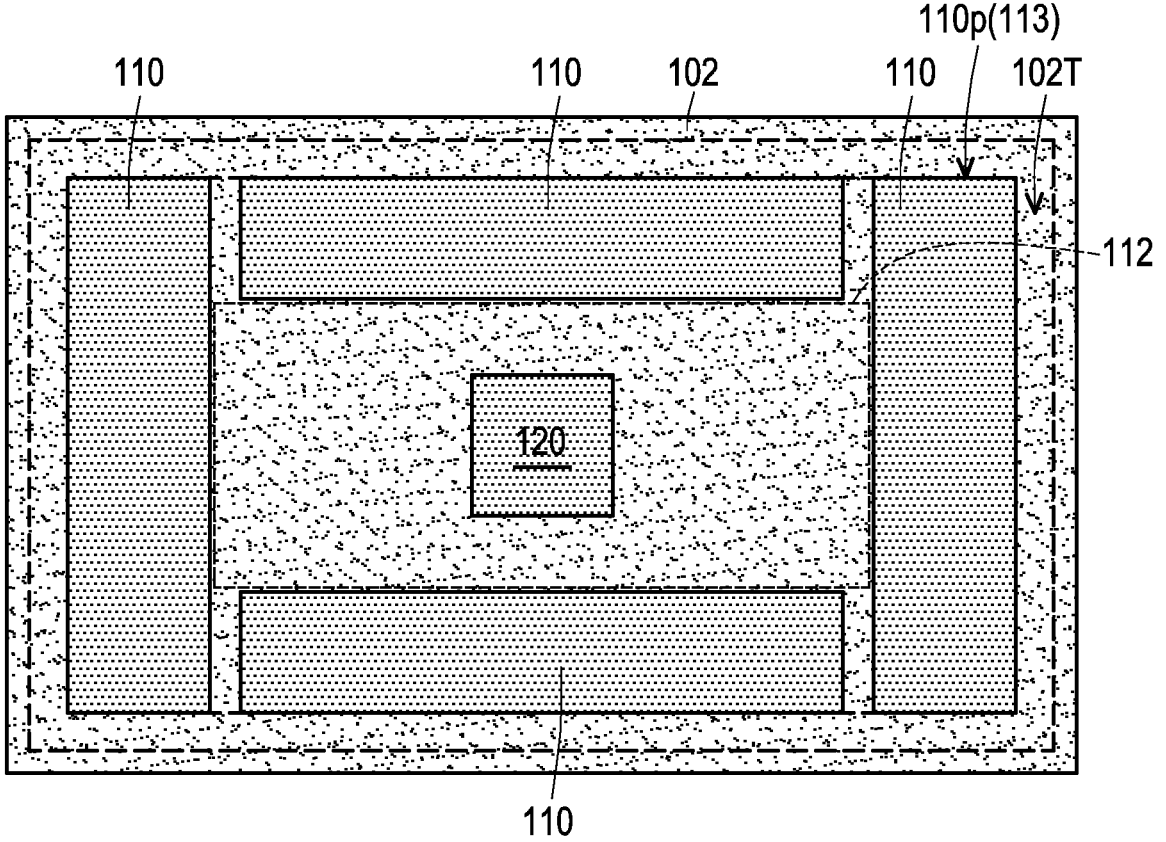

Referring to FIG. 9A and FIG. 10A, a substrate 102 is provided, and a trench 102T is formed along a periphery of the substrate 102. The trench 102T may be formed by a dicing (cutting) process. In some embodiments, the trench 102T has a width in a range of about 10 μm to about 200 μm, and a depth in a range of about 30 μm to about 600 μm. The substrate 102 of FIG. 9A may be similar to the substrate 102 in the previous embodiments, so the detailed description thereof is omitted herein.

Figure 9B:
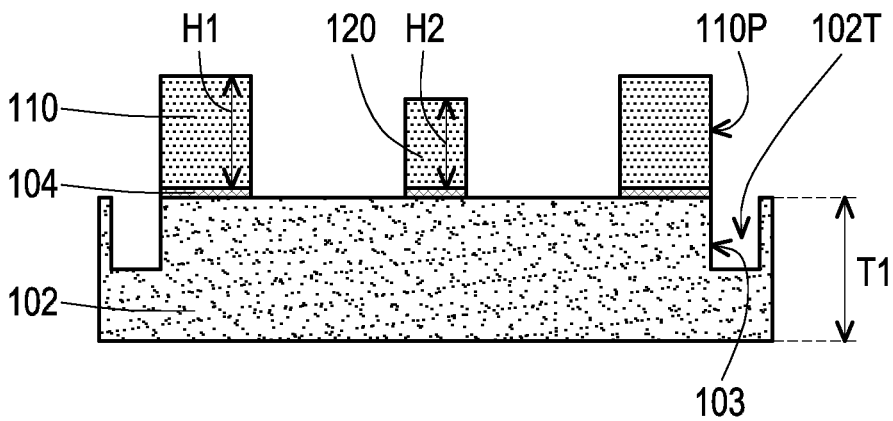

Referring to FIG. 9B and FIG. 10B, a plurality of first dies 110 and a second die 120 are picked and placed over the substrate 102. In some embodiments, the first die 110 is disposed on the substrate 102 immediately adjacent to the trench 102T. In some embodiments, a periphery 110p of the first dies 110 is substantially aligned with an inner sidewall 103 of the trench 102T. The arrangement of the first dies 110 and the second die 120 may be similar to that in the previous embodiments, so the detailed description thereof is omitted herein.

Figure 9C:
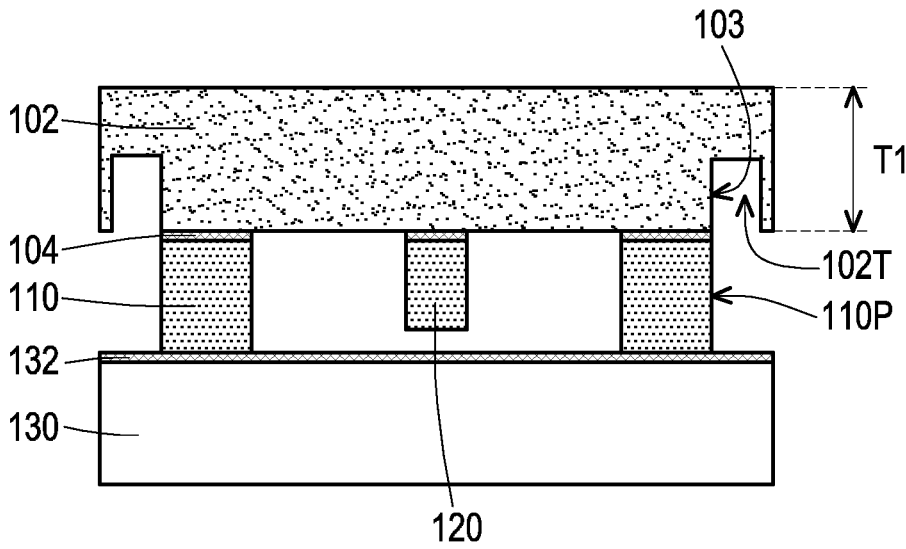

Referring to FIG. 9C, the structure of FIG. 9B is flip-bonded to a temporary carrier 130. In some embodiments, after bonding, the trench 102T faces the temporary carrier 130. The bonding method may be similar to the bonding method of FIG. 1B, so the detailed description thereof is omitted herein.

Figure 9D:
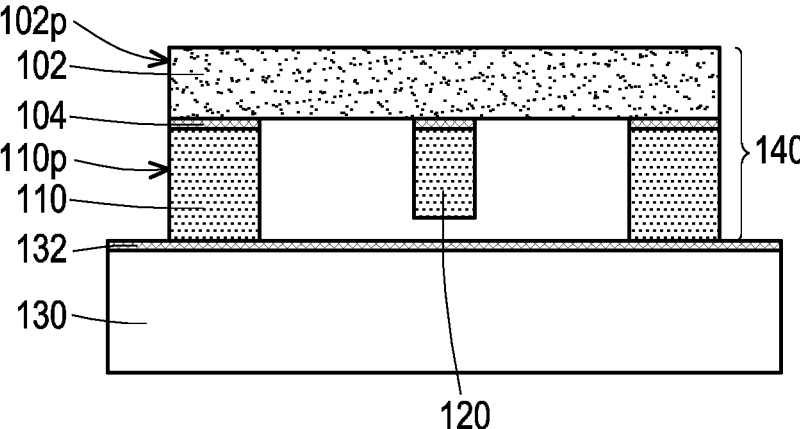

Referring to FIG. 9D, a thinning process is performed on the substrate 102, so as to form a semiconductor device 140. In some embodiments, the thinning process is performed on an exposed surface of the substrate 102, and the thinning process is terminated as the trench 102T is reached. In detailed, when the trench 102T is reached, portions of the substrate 102 outside the periphery 110p of the first dies 110 are cut-off since they are separated from other portions of the substrate 102. Accordingly, as shown in FIG. 9D, after the thinning process, the semiconductor device 140 is formed, and a periphery 102p of the substrate 102 is substantially flush with the periphery 110p of the first dies 110.

FIG. 11 illustrates a manufacturing method of a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a first semiconductor device is formed by bonding a plurality of semiconductor blocks on a first substrate. FIG. 1A to FIG. 1D and FIG. 9A to FIG. 9D illustrate varying views corresponding to some embodiments of act S300.

At act S302, the first semiconductor device is bonded to a second substrate through a first adhesive layer, wherein the semiconductor blocks are disposed between the first substrate and the second substrate, and a cavity is formed among the semiconductor blocks, the first substrate and the second substrate. FIG. 1E to FIG. 1I, FIG. 5A to FIG. 5C and FIG. 8 illustrate varying views corresponding to some embodiments of act S302.

In accordance with some embodiments of the disclosure, a semiconductor package includes a first substrate and a first semiconductor device. The first semiconductor device is bonded to the first substrate and includes a second substrate, a plurality of first dies and a second die. The first dies are disposed between the first substrate and the second substrate. The second die is surrounded by the first dies. A cavity is formed among the first dies, the first substrate and the second substrate, and a gap is formed between the second die and the first substrate.

In accordance with some embodiments of the disclosure, a semiconductor package includes a substrate, a first adhesive layer, a first semiconductor device and a first sealant. The first adhesive layer is disposed on the substrate. The first semiconductor device is adhered to the substrate through the first adhesive layer. The first semiconductor device includes a flexible substrate and a plurality of semiconductor blocks. The semiconductor blocks are adhered to the flexible substrate through a second adhesive layer, and the semiconductor blocks are arranged to surround a region. A cavity is formed among the semiconductor block, the flexible substrate and the substrate below the region. The first sealant is disposed on the first adhesive layer and inserted between the semiconductor blocks.

In accordance with some embodiments of the disclosure, a manufacturing method of a semiconductor package includes following steps. A first semiconductor device is provided by bonding a plurality of semiconductor blocks on a first substrate, wherein the semiconductor blocks are arranged to form a wall-like structure. A second substrate is provided with a first adhesive layer thereon. The first semiconductor device is bonded to the second substrate through the first adhesive layer, to form a cavity among the semiconductor blocks, the first substrate and the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first substrate; and
a first semiconductor device over the first substrate, comprising:
a semiconductor substrate; and
a plurality of first dies between the first substrate and the semiconductor substrate; and
a second die surrounded by the first dies, wherein an enclosed cavity is formed among sidewalls of the first dies facing the second die, a surface of the first substrate and a surface of the semiconductor substrate, the enclosed cavity is an empty space, and a gap is formed between the second die and the first substrate.

2. The semiconductor package of claim 1, wherein a height of the second die is smaller than a height of the first dies.

3. The semiconductor package of claim 1, wherein the first semiconductor device is bonded to the first substrate through a first adhesive layer, wherein the first adhesive layer is a non-conductive layer and the first adhesive layer has a laminated structure.

4. The semiconductor package of claim 1, wherein the first semiconductor device is bonded to the first substrate through a first adhesive layer, the first dies are in physical contact with the first adhesive layer, and the second die is separated from the first adhesive layer by the gap.

5. The semiconductor package of claim 1, further comprising a second adhesive layer between the first dies and the semiconductor substrate and between the second die and the semiconductor substrate.

6. The semiconductor package of claim 1, wherein a sidewall of the semiconductor substrate is substantially flush with a sidewall of the first dies.

7. The semiconductor package of claim 1 further comprising a plurality of sensing electrodes on the first semiconductor device.

8. The semiconductor package of claim 1, wherein an entire surface of the second die facing the first substrate is not connected to the first substrate, and the gap continuously extends from a first sidewall of the second die to a second sidewall of the second die opposite to the first sidewall of the second die.

9. A semiconductor package, comprising:
a substrate;
a first adhesive layer on the substrate;
a first semiconductor device adhered to the substrate through the first adhesive layer, comprising:
a semiconductor substrate; and
a plurality of semiconductor blocks adhered to the semiconductor substrate through a second adhesive layer, wherein the semiconductor blocks are arranged to surround a region, an enclosed cavity is formed among sidewalls of the semiconductor blocks, a first surface of the semiconductor substrate and a surface of the substrate below the region, and the enclosed cavity is an empty space; and
a first sealant, disposed on the first adhesive layer and inserted between the semiconductor blocks.

10. The semiconductor package of claim 9, wherein a material of the first sealant is substantially the same as a material of the first adhesive layer.

11. The semiconductor package of claim 9, wherein no interface exists between the first adhesive layer and the first sealant.

12. The semiconductor package of claim 9, further comprising:
a second semiconductor device adhered to the substrate through the first adhesive layer; and
an encapsulant encapsulating the first semiconductor device and the second semiconductor device.

13. The semiconductor package of claim 12, wherein a surface of the encapsulant, a second surface opposite to the first surface of the semiconductor substrate and a surface the second semiconductor device are substantially coplanar.

14. The semiconductor package of claim 12, further comprising:
a plurality of sensing electrodes on the first semiconductor device; and a plurality of conductive connectors on the second semiconductor device and electrically connected to the sensing electrodes.

15. A semiconductor package, comprising:
a first semiconductor device, comprising a plurality of first semiconductor blocks on a first substrate, wherein the first semiconductor blocks are arranged to form a wall-like structure; and
a semiconductor substrate, wherein the semiconductor substrate is bonded to the first semiconductor device through a first adhesive layer, wherein the first semiconductor blocks are disposed between the first substrate and the semiconductor substrate, and an enclosed cavity unfilled with other solid material is formed among sidewalls of the first semiconductor blocks, a surface of the first substrate and a surface of the semiconductor substrate.

16. The semiconductor package of claim 15, further comprising:
a second semiconductor device, bonded to the semiconductor substrate through the first adhesive layer; and
an encapsulant different from the first adhesive layer, encapsulating the first semiconductor device and the second semiconductor device.

17. The semiconductor package of claim 16, further comprising:
a plurality of sensing electrodes on the first semiconductor device; and
a plurality of conductive patterns on the second semiconductor device and electrically connected to the sensing electrodes.

18. The semiconductor package of claim 15, further comprising a second semiconductor block on the first substrate, wherein the second semiconductor block is surrounded by the first semiconductor blocks.

19. The semiconductor package of claim 18, wherein a periphery of the first substrate is substantially flush with a periphery of the first semiconductor blocks.

20. The semiconductor package of claim 15, wherein at least one of the first semiconductor blocks is embedded in the first adhesive layer.

* * * * *